United States Patent
Su

(10) Patent No.: US 6,546,125 B1
(45) Date of Patent: Apr. 8, 2003

(54) PHOTOLITHOGRAPHY MONITORING USING A GOLDEN IMAGE

(75) Inventor: Bo Su, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/201,740

(22) Filed: Dec. 1, 1998

(51) Int. Cl.⁷ .................................................. G06K 9/00
(52) U.S. Cl. ......................... 382/144; 382/145; 348/87
(58) Field of Search ........................ 382/141, 143–147, 382/149, 151, 152, 153; 348/86, 87, 125, 126; 702/57, 58, 59; 700/152; 356/399, 400, 401

(56) References Cited

U.S. PATENT DOCUMENTS 5,640,200 A * 6/1997 Michael ....................... 348/87
5,657,235 A * 8/1997 Liebmann et al. .......... 700/182
5,850,466 A * 12/1998 Schott ......................... 382/141

* cited by examiner

Primary Examiner—Samir Ahmed
Assistant Examiner—Vikkram Bali
(74) Attorney, Agent, or Firm—Sughrue Mion MacPhearson LLP

(57) ABSTRACT

A method for monitoring the focus-exposure settings of a stepper in a photolithography process is disclosed. A golden image of the target is stored in the CD-SEM. Then, during the FEM measurements, the target of each die is compared to the golden image, and a PR score is stored. Thus, a matrix, or a look-up table, is constructed which provides a PR score for each die with respect to the golden image. Then, during a line monitoring, when a target image is obtained it is compared to the golden image and a PR score is obtained. If the measured CD turns out to be out of bound, the PR score is checked against the PR matrix of the FEM to see the focus-exposure parameters that resulted in such a PR score. Such a matching would indicate the actual drift of the focus or exposure of the stepper.

7 Claims, 3 Drawing Sheets

PHOTOLITHOGRAPHY MONITORING USING A GOLDEN IMAGE

BACKGROUND OF THE INVENTION

1. Field of the Invention

The present invention is directed to a method and apparatus for use in the photolithographic arts, particularly the semiconductor fabrication arts.

2. Description of the Related Art

In the fabrication of semiconductor devices, photolithographic masks are used to transfer circuitry patterns to silicon wafers in the creation of integrated circuits in general, in the production of semiconductor circuit devices, a series of such masks are employed in a preset sequence. Each photolithographic mask includes an intricate pattern of CAD-generated geometric patterns corresponding to the circuit components to be integrated onto the wafer. Each mask in the series is used to transfer its corresponding pattern onto a photosensitive layer (photoresist) which has been previously deposited on the silicon wafer. The transfer of the mask pattern onto the photosensitive layer or photoresist is currently performed by an optical exposure tool, which directs light or radiation through the mask to the photoresist.

Fabrication of the photolithographic mask follows a set of predetermined design rules which are set by processing and design limitations. For example, these design rules define the space tolerance between devices or interconnecting lines, and the width of the lines themselves, to ensure that the devices or lines do not overlap or interact with one another in undesirable ways. The design rule limitation is referred to within the industry as the "CD" (critical dimension). The critical dimension of a circuit is defined as the smallest width of a line or the smallest space between two lines which is to be permitted in the fabrication of the chip. More often than not, the CD is determined by the resolution limit of the exposure equipment. Presently, the CD for most applications is on the order of a fraction of a micron. Because of the extremely small scale of the CD, the instrument of choice for measurement and inspection is a scanning electron microscope (SEM).

When new masks are produced, or after any change in the fabrication recipe, it is customary to form a so-called focus exposure matrix (FEM) on a test wafer in order to obtain the best exposure/focus combination for the mask, e.g., the combination of focus and exposure which results in the best resolution on the wafer, in keeping with the required CD. This is typically done by, for example, sequentially exposing a series of areas of the wafer with the pattern of the mask, while exposure and focus values are incrementally changed from one exposure location to the next. After exposure of the wafer in this fashion, one can examine the individual exposure sites, for example, to check the CD, and obtain a plot of exposure v. focus or focus v. CD and determine the area of best performance from the resulting curves. Specifically, a test wafer is exposed in a stepper while the focus is varied along one axis and the exposure is varied along the other. Thus, a matrix of images is obtained on the exposed wafer, wherein each exposure site or die has a different focus-exposure setting. Selected CDs (at various locations) in each die are measured to select the best exposure-focus setting for the particular mask.

The general procedure for determining the CD in a test wafer is as follows. First, an alignment target (which is not part of the circuitry) is included on the mask, typically at an area which will not include circuit patterns. During exposure, an image of the alignment target is transferred onto each of the dies. When the test wafer is developed and loaded into the CD measurement machine (typically a CD SEM) the operator first causes the system to acquire the alignment target of the central or reference die of the wafer. The image of this alignment target is stored in memory for reference. The operator then acquires an appropriate area for CD measurement, and designates that area to the CD machine. The machine automatically calculates a vector from the center of the alignment target to the center of the designated area. This procedure is repeated for each area which the operator wishes to measure.

The foregoing procedure can be performed in what might be designated as a "teaching mode" of the CD SEM. Once all of the data has been input and the vectors calculated, the CD system may then be enabled for automated CD measurement as described below.

When the developed wafer is properly loaded into the CD machine, the machine moves to the first die to be inspected and searches for the alignment target using a pattern recognition (PR) algorithm, using the aforementioned stored alignment target as a reference. When a high PR score is achieved, it is considered that the alignment target has been acquired. Using the stored vector, the CD machine then moves to the designated CD measurement site and acquires an image for CD measurement, which is then performed. Following this procedure, which may be duplicated for other locations on the die, the CD machine then goes to the next die and again using the PR algorithm searches for the alignment target using the stored target as a reference. Once a high PR score is achieved, the CD machine goes to the CD measurement site using the stored vector. This process is repeated until all of the designated dies have been measured.

When the measured CD is found to be outside a pre-designated value range, it signifies that something is wrong with the stepper. However, it is not known from the CD measurement whether it is the focus or the exposure that is out of its limits. Therefore, other tests needs to be performed to determine the cause of the problem.

SUMMARY OF THE INVENTION

The present invention provides a method to rapidly determine the cause of the out of bounds CD. Specifically, the inventive method allows obtaining that information at the same time the CD is being measured, thus avoiding any reduction in the throughput of the CD-SEM.

According to an advantageous feature of the invention, a golden image of the target is stored in the CD-SEM. Then, during the FEM measurements, the target of each die is compared to the golden image, and a PR score is stored. Thus, a matrix, or a look-up table, is constructed which provides a PR score for each die with respect to the golden image. Then, during a line monitoring, when a target image is obtained it is compared to the golden image and a PR score is obtained. If the measured CD turns out to be out of bound, the PR score is checked against the PR matrix of the FEM to see the focus-exposure parameters that resulted in such a PR score. Such a matching would indicate the actual drift of the focus or exposure of the stepper.

DETAILED DESCRIPTION OF THE PREFERRED EMBODIMENTS

Figure 1:
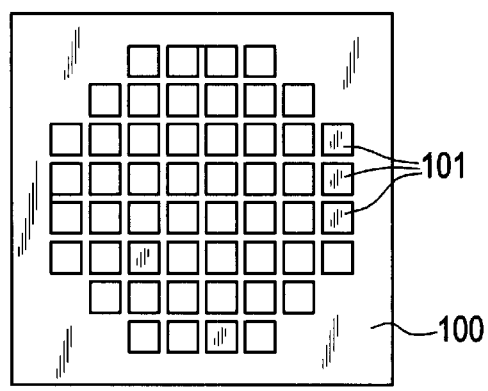
FIG. 1 illustrates a portion of a typical photolithographic mask, common to both the prior art and the invention.

FIG. 1 illustrates a portion of a typical photolithographic mask 100, illustrating a number of circuit patterns 101, shown schematically. In the illustrated case, several circuit patterns are shown; however, it is also customary to have only a few circuit patterns, e.g., 2 or 4, in which case the mask can be used in a "step and scan" method of exposing the wafers.

Figure 2:
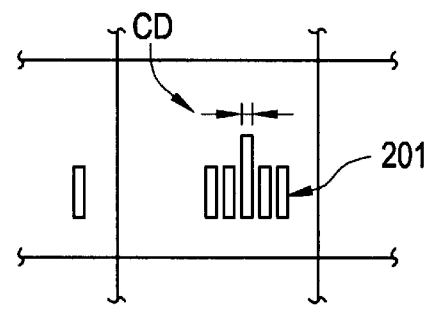
FIG. 2 is an enlargement of a portion of FIG. 1, illustrating one example of an alignment target.

As defined previously, the "critical dimension" CD is the width of a line and/or the distance between adjacent lines of such a pattern, as transferred to the wafer surface. Each circuit pattern 101 of the illustrated mask includes a target, shown in more detail in the enlarged view of FIG. 2. As shown, the target is a series of lines 201 which may run in various directions and may represent a unique easily-recognizable shape.

Figure 3:
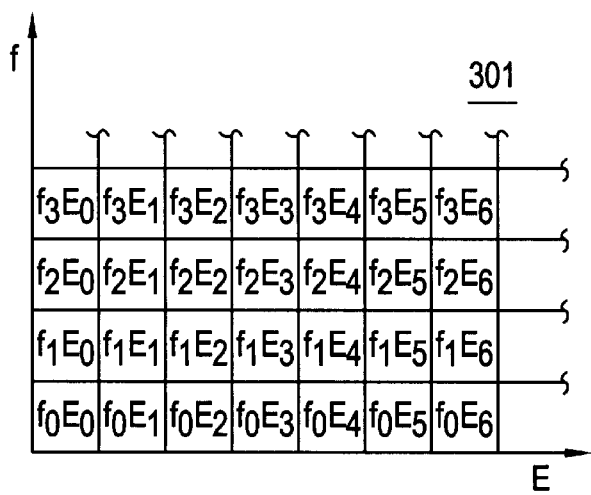
FIG. 3 illustrates a matrix of a focus-exposure matrix.
Figure 4:
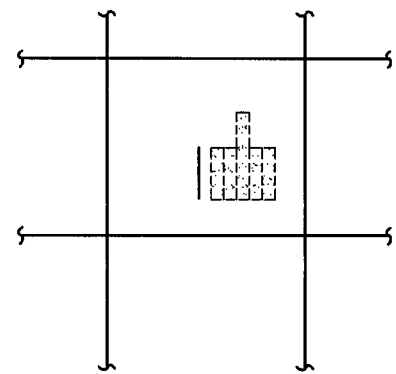
FIG. 4 illustrates a "degraded" acquisition target which is spatially and/or sequentially distant from the target shown in FIG. 2.

FIG. 3 illustrates a portion of a focus-exposure matrix. The matrix 301 is formed by patterning the wafer surface using light or other radiation passing through the mask. A single wafer may include hundreds of dies, each one of which corresponds to one of the exposure areas shown in FIG. 3. For convenience, only a small number of the dies are illustrated. Each of the dies of the matrix has an incrementally different exposure E and/or was formed with an incrementally different focus f than any of the surrounding dies, as referenced by nomenclature fnEm in the drawings. As mentioned previously, with respect to the overall matrix, the focus may be varied along one axis while the exposure is varied along the other axis in the formation of the matrix.

Figure 5:
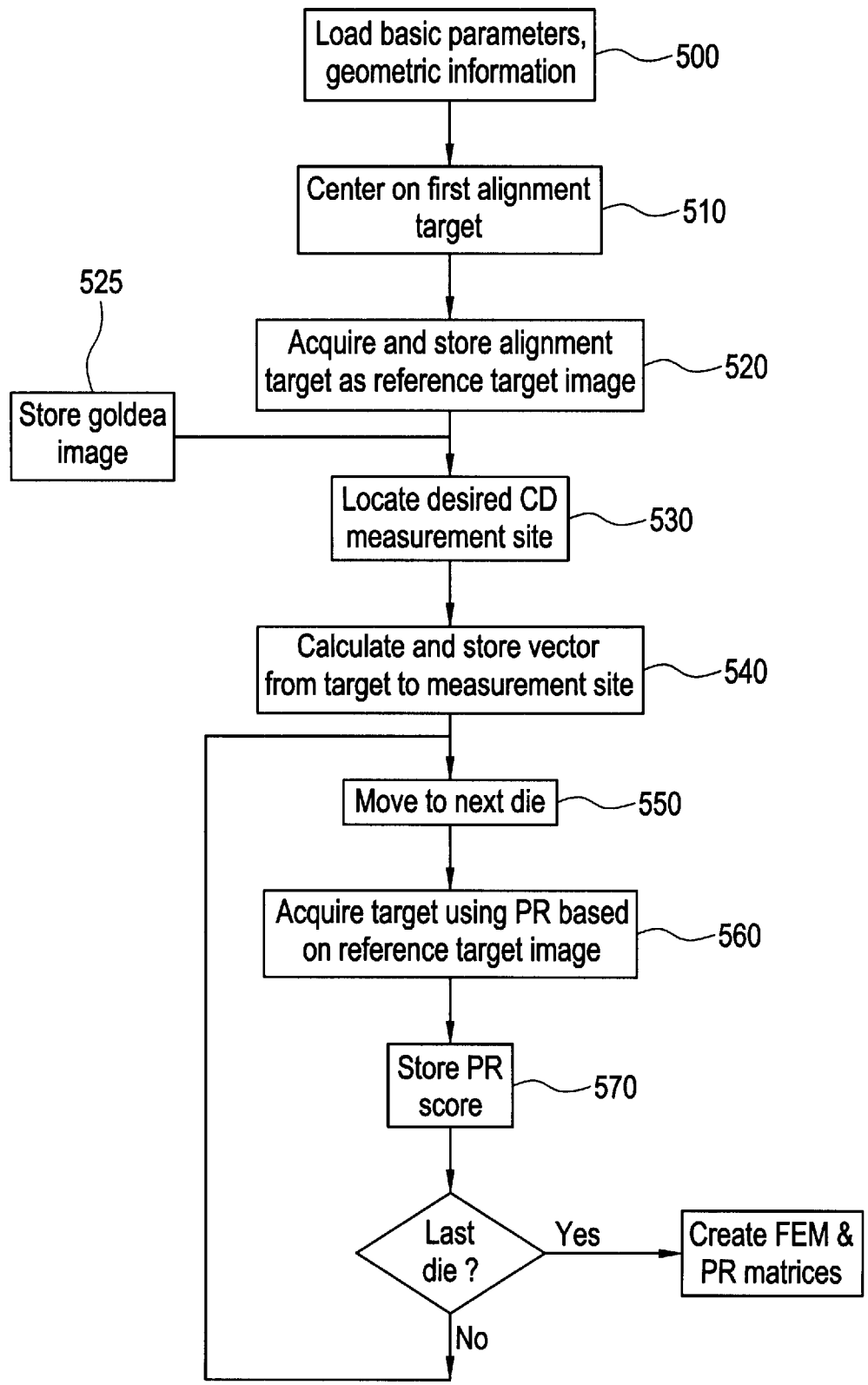
FIG. 5 is a flow chart illustrating the major steps of the invention.

FIG. 5 is a flow chart illustrating the major steps of creating a FEM and PR score matrices according to a preferred embodiment of the invention. According to the invention, the die inspection sequence of the FEM wafer is programmed into the CD SEM machine somewhat similarly to that described with regard to the related art, above. In this process, the CD SEM machine may be given basic geometric information about the wafer, such as the general layout of the dies, the die-to-die distance (e.g., center-to-center) and any other information necessary to enable the CD machine to move generally from one die to the next in an automated fashion (Step 500).

The CD machine is first centered by the operator on the alignment target of the first die to be inspected (Step 510). In general, this may be the middle die, in which the focus-exposure parameters are at their optimum value. Alternatively, this can be the first die on the wafer, or any other die chosen by the operator. The alignment target of the first die to be inspected is thus acquired and the image of the alignment target is stored as the reference for at least one subsequent inspection step (Step 520).

At some point in the process, a golden image of a target is obtained and stored. This image may be an artificial image from the CAD design, the image obtained at the first die to be inspected (especially if it is the middle die), or a modified image from the first die to be inspected. Thus, in this example, this step is marked as Step 525, following the acquisition of the first target image.

Once the first target is acquired, the operator moves the CD machine to a desired measurement site and designates this site for CD measurement (Step 530). The vector from the target location to the CD measurement site is calculated and stored (Step 540). Several measurement sites can be designated, and their vectors calculated and stored. This completes what may be termed the recipe stage.

Figure 6:
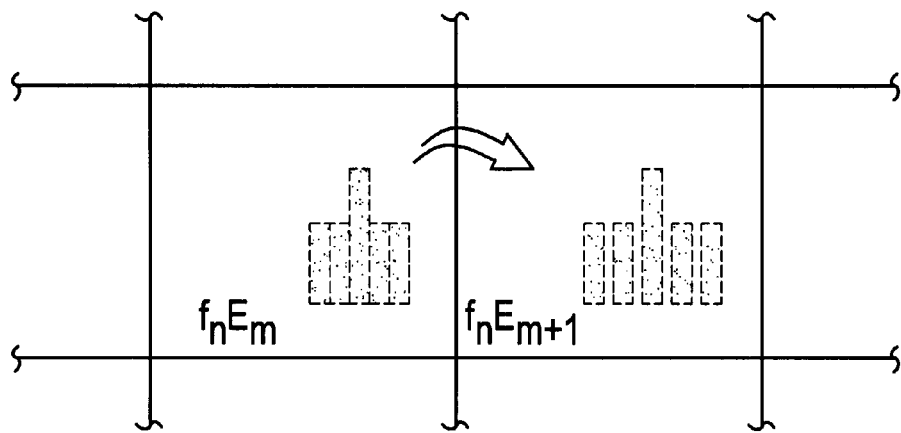
FIG. 6 illustrates the comparison process between "adjacent" targets.

Following this, the CD machine can be then placed in the automatic operation mode. In this mode, the CD machine is automatically moved to the second die in the inspection sequence and pattern recognition is performed to acquire the alignment target of the second die (Steps 550 and 560; see also FIG. 6). The PR score achieved by the pattern recognition for that target is stored for future reference (Step 570). It is then checked whether there are more dies to inspect, if so, the machine goes to the next die and the sequence Step 550–570 is repeated. Is all the dies have been inspected, the machine then construct FEM matrix and PR score matrix. Of course, other conventional presentations can be used, such as Bossung curves.

Figure 7:
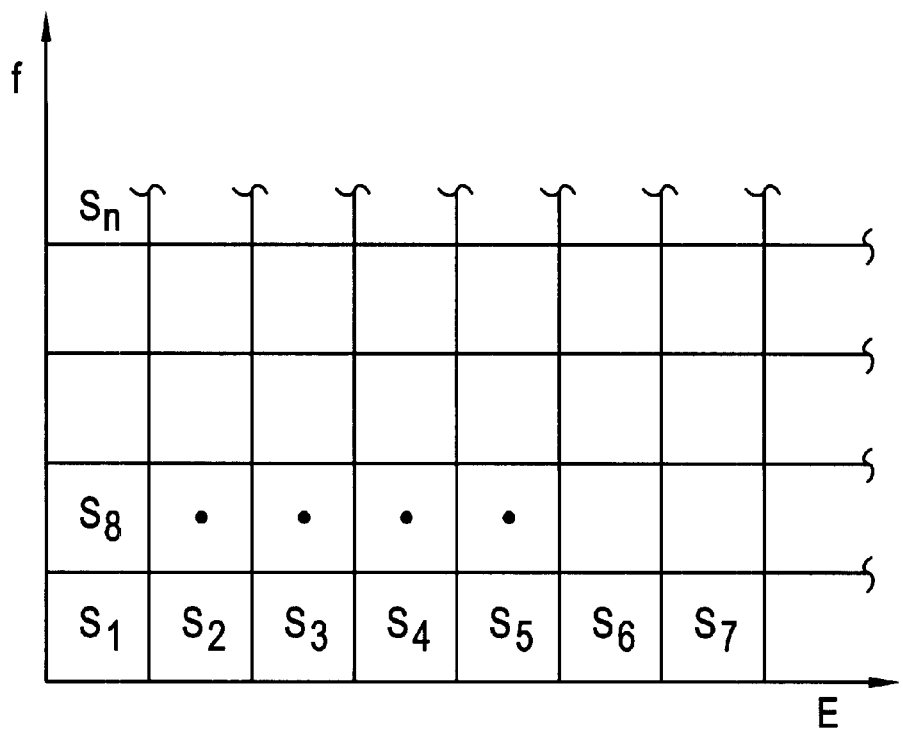
FIG. 7 illustrates a simulated focus-exposure matrix.

FIG. 7 exemplifies the PR score matrix. Specifically, for each die, and its corresponding focus-exposure parameters, a particular PR score is stored, indicating the PR score achieved in comparing that die's target image to the golden image. This may be implemented as a look-up table in a general purpose computer or the computer running the SEM.

Subsequently, during in-line or monitoring of production wafers, when production wafers are loaded onto the CD-Sem for CD measurement, each acquired target is also compared to the golden image and a PR score is obtained. This PR score is compared to the stored PR scored and, when correlation is achieved, the focus exposure settings can be fetched from the PR matrix. This can be used as a monitoring tool to flag drifts in the focus-exposure settings of the stepper, even before the CD goes off limits.

Moreover, when it is found that the CD has gone out of limit, the PR score of that die can be compared to the PR matrix, and the focus-exposure parameters can be fetched. That would provide an indication of why the CD has gone out of limits.

It should be appreciated that the PR matrix can be re-arranged according to parameter drift, rather than FEM die location. That is, in such a case PR score S1 would not correspond to the $f_0E_0$ of FIG. 3, but rather correspond to the most optimized setting of the focus and exposure parameters for that particular process. In such a case, if a PR score matches that of $S_1$, it would indicate that the focus-exposure settings are in their optimal status. On the other hand, if a PR score matches that of $S_7$, it indicates that the exposure has drifted, while if it matches $S_n$, it indicates that the focus has drifted.

Although the invention has been described and shown in terms of preferred embodiments thereof, it will be understood by those skilled in the art that changes in form and detail may be made therein without departing from the spirit and scope of the invention as defined in the appended claims.

What is claimed is:

1. A method of monitoring focus-exposure settings in photolithography process, comprising:

a. storing a single golden image of a target;

b. performing a pattern recognition process on a FEM wafer using said single golden image to obtain a reference pattern recognition score;

c. creating a focus exposure matrix based on specific exposure and focus conditions used in forming the FEM wafer; and d. constructing a reference pattern recognition score matrix from the values obtained in step (b) corresponding to the focus exposure matrix.

2. The method as claimed in claim 1, wherein the golden image is obtained from a CAD design of a mask.

3. The method as claimed in claim 1, wherein the golden image is an image obtained from a die exposed at optimum focus-exposure settings.

4. A method of monitoring focus-exposure settings in photolithography process, comprising:

a. storing a golden image of a target;

b. performing a pattern recognition process on a FEM wafer using said golden image, to obtain a reference pattern recognition score;

c. creating a focus exposure matrix based on specific exposure and focus conditions used in forming the FEM wafer;

d. constructing a reference pattern recognition score matrix corresponding to the focus exposure matrix;

e. inspecting a production wafer and obtaining a pattern recognition score for inspected dies within the production wafer; and, f. comparing said pattern recognition score to scores in said reference pattern recognition score matrix.

5. A method of monitoring focus-exposure settings in photolithography process, comprising:

a. storing a golden image of a target;

b. performing a pattern recognition process on a FEM wafer using said golden image, to obtain a reference pattern recognition score;

c. creating a focus exposure matrix based on specific exposure and focus conditions used in forming the FEM wafer;

d. constructing a reference pattern recognition score matrix corresponding to the focus exposure matrix; and e. correlating the reference pattern recognition score of step (b) with the reference pattern recognition matrix in step (d) to provide real-time information regarding the focus exposure settings in the photolithography process.

6. An apparatus for determining focus-exposure settings in a photolithography process, comprising:

golden image acquisition means for acquiring a single golden image of a target;

pattern recognition means for comparing a select number of dies on a FEM wafer to the golden image to obtain a reference pattern recognition score for each of the select number of dies; and correlating means for obtaining the focus-exposure settings of a selected die based on the reference pattern recognition score of the selected die.

7. The apparatus for determining focus-exposure settings according to claim 6, wherein the correlating means obtains the focus-exposure settings in real-time.

* * * * *